(12) United States Patent
Jang et al.

(10) Patent No.: US 9,029,998 B2
(45) Date of Patent: May 12, 2015

(54) SEMICONDUCTOR PACKAGE DEVICE

(71) Applicant: Samsung Electronics Co., Ltd., Suwon-si, Gyeonggi-do (KR)

(72) Inventors: Eon Soo Jang, Suwon-si (KR); Kyol Park, Daejeon (KR); Yunhyeok Im, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/243,165

(22) Filed: Apr. 2, 2014

(65) Prior Publication Data
US 2014/0339708 A1 Nov. 20, 2014

(30) Foreign Application Priority Data
May 16, 2013 (KR) .................. 10-2013-0055849

(51) Int. Cl.
*H01L 23/02* (2006.01)
*H01L 23/34* (2006.01)
(Continued)

(52) U.S. Cl.
CPC ............... *H01L 23/34* (2013.01); *H01L 23/12* (2013.01); *H01L 23/3128* (2013.01);
(Continued)

(58) Field of Classification Search
USPC ............... 257/686, 707, 777, 787, 723, 724
See application file for complete search history.

(56) References Cited

U.S. PATENT DOCUMENTS 7,714,453 B2 * 5/2010 Khan et al. .................. 257/787
7,777,351 B1 * 8/2010 Berry et al. .................. 257/778
(Continued)

FOREIGN PATENT DOCUMENTS

| JP | 2012-033875 | 2/2012 |
|---|---|---|
| KR | 10-2007-0076084 | 7/2007 |
| KR | 10-1228623 | 1/2013 |

*Primary Examiner* — Sheila V Clark
(74) *Attorney, Agent, or Firm* — Ellswoth IP Group PLLC

(57) ABSTRACT

A semiconductor package device includes a lower package including a lower semiconductor chip mounted on the lower package substrate, a lower molding compound layer disposed on the lower package substrate, a first trench formed in the lower molding compound layer to surround the lower semiconductor chip, and a second trench connected to the first trench to extend to an outer wall of the lower package, the second trench being formed in the lower molding compound layer, an upper package disposed on the lower package. The upper package includes an upper package substrate and at least one upper semiconductor chip mounted on the upper package substrate and a heat transfer member disposed between the lower package and the upper package.

20 Claims, 20 Drawing Sheets

(51) Int. Cl.
    *H01L 23/12*    (2006.01)
    *H01L 23/31*    (2006.01)
    *H01L 25/10*    (2006.01)
    *H01L 23/00*    (2006.01)
    *H01L 25/065*    (2006.01)

(52) U.S. Cl.
    CPC ............... *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 25/0655* (2013.01); *H01L 25/0657* (2013.01); *H01L 25/105* (2013.01); *H01L 2224/131* (2013.01); *H01L 2224/16225* (2013.01); *H01L 2224/2919* (2013.01); *H01L 2224/29194* (2013.01); *H01L 2224/2929* (2013.01); *H01L 2224/29309* (2013.01); *H01L 2224/32145* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2225/0651* (2013.01); *H01L 2225/1023* (2013.01); *H01L 2225/1058* (2013.01); *H01L 2225/1076* (2013.01); *H01L 2225/1094* (2013.01); *H01L 2924/1431* (2013.01); *H01L 2924/1433* (2013.01); *H01L 2924/1436* (2013.01); *H01L 2924/1438* (2013.01); *H01L 2924/15311* (2013.01); *H01L 2924/15331* (2013.01); *H01L 2924/1815* (2013.01); *H01L 2924/18161* (2013.01); *H01L 2924/3511* (2013.01); *H01L 2225/06568* (2013.01)

(56) References Cited

U.S. PATENT DOCUMENTS

| | | | |
|---|---|---|---|
| 7,838,979 | B2 | 11/2010 | Oh |
| 8,154,135 | B2 | 4/2012 | Kim et al. |
| 8,198,136 | B2 | 6/2012 | Oh |
| 8,253,256 | B2 | 8/2012 | Jo |
| 8,299,592 | B2 | 10/2012 | Suh et al. |
| 8,299,595 | B2 | 10/2012 | Yoon et al. |
| 8,378,476 | B2 | 2/2013 | Lee et al. |
| 8,462,511 | B2 | 6/2013 | Lee |
| 8,669,140 | B1 * | 3/2014 | Muniandy et al. ............ 438/109 |
| 8,829,686 | B2 * | 9/2014 | Hong et al. .................... 257/777 |
| 2006/0278991 | A1 | 12/2006 | Kwon et al. |
| 2009/0102002 | A1 | 4/2009 | Chia et al. |
| 2012/0013007 | A1 | 1/2012 | Hwang et al. |
| 2012/0074586 | A1 | 3/2012 | Seo et al. |
| 2012/0139090 | A1 | 6/2012 | Kim et al. |
| 2013/0075887 | A1 | 3/2013 | Suzuki |

\* cited by examiner

SEMICONDUCTOR PACKAGE DEVICE

CROSS-REFERENCE TO RELATED APPLICATIONS

This U.S. non-provisional patent application claims priority under 35 U.S.C. §119 from Korean Patent Application No. 10-2013-0055849, filed on May 16, 2013, the entire contents of which are hereby incorporated by reference.

BACKGROUND

1. Field

The present general inventive concept herein relates to a semiconductor package device, and more particularly, to a package on package (PoP) device.

2. Description of the Related Art

Regarding advancements in the field of electronics, high functionality, high response rate, and miniaturization of electronic components are becoming increasingly important. Particularly, as smaller and thinner communication devices such as mobile phones, tablet personal computers (PCs), etc., are increasingly used, development of smaller and thinner semiconductor packages included in the communication devices has increased. In accordance with these trends, a semiconductor package device having a structure in which a plurality of semiconductor chips are stacked and mounted on one package substrate, or a semiconductor package device having a structure in which semiconductor packages are stacked on each other, has been an issue. In particular, a PoP device where packages are stacked on each other has developed, thus requiring improvements in semiconductor package reliability, stability, and efficiency.

SUMMARY

The present general inventive concept provides a package on package (PoP) device that is a semiconductor package device having excellent heat release efficiency.

The present general inventive concept also provides a PoP device that is a semiconductor package in which an electrical signal between semiconductor chips within the package is transmitted without interfering with a heat transfer member.

Additional features and utilities of the present general inventive concept will be set forth in part in the description which follows and, in part, will be obvious from the description, or may be learned by practice of the general inventive concept.

The foregoing and/or other features and utilities of the present general inventive concept are achieved by providing semiconductor package devices including a lower package including a lower package substrate, a lower semiconductor chip mounted on the lower package substrate, a lower molding compound layer disposed on the lower package substrate, a first trench defined in the lower molding compound layer to surround the lower semiconductor chip, and a second trench connected to the first trench to extend to an outer wall of the lower package, the second trench being defined in the lower molding compound layer, an upper package disposed on the lower package, wherein the upper package includes an upper package substrate and at least one upper semiconductor chip mounted on the upper package substrate, and a heat transfer member disposed between the lower package and the upper package.

The outer wall of the lower package may include four sidewalls and four edges.

The second trench may extend from the first trench to at least one edge or at least one sidewall of the lower package.

The heat transfer member may be disposed between a bottom surface of the upper package substrate and a top surface of the lower semiconductor chip and in the first trench, or between the bottom surface of the upper package substrate and the top surface of the lower semiconductor chip and in the first and second trenches.

At least one trench of the first and second trenches may expose the top surface of the lower package substrate.

The semiconductor package device may further include a conductive pad disposed on the top surface of the lower package substrate exposed by the at least one trench, wherein the conductive pad contacts the heat transfer member.

The first trench may expose a side surface of the lower semiconductor chip.

The first or second trench may have an uneven bottom surface.

The first and second trenches may include depths or upper widths different from each other.

The foregoing and/or other features and utilities of the present general inventive concept may also be achieved by providing semiconductor package devices include a lower package including a lower package substrate on which a conductive pad is disposed on a top surface thereof, a lower semiconductor chip mounted on a top surface of the lower package, a lower molding compound layer disposed on the top surface of the lower package, a first trench defined in the lower molding compound layer to surround the lower semiconductor chip, and at least one second trench connected to the first trench to extend to an outer wall of the lower package, the at least one second trench being defined in the lower molding compound layer, an upper package including an upper package substrate disposed on the lower package and at least one upper semiconductor chip mounted on a top surface of the upper package substrate, and a heat transfer member disposed between the top surface of the lower semiconductor chip and a bottom surface of the upper package substrate and in the first trench.

The outer wall of the lower package may include sidewalls and edges, wherein the second trench extends from the first trench to at least one edge or at least one sidewall of the lower package.

The heat transfer member may be further disposed in the second trench.

The second trench exposes the conductive pad of the lower package substrate, and the heat transfer member contacts the conductive pad.

The semiconductor package device may further include a via connection terminal connecting the lower package substrate to the upper package substrate.

The first trench may expose the lower package substrate.

The first trench may expose a side surface of the lower semiconductor chip, wherein the heat transfer member contacts the side surface of the lower semiconductor chip.

The foregoing and/or other features and utilities of the present general inventive concept may also be achieved by providing semiconductor package devices include a package substrate, a semiconductor chip mounted on the package substrate, and a molding compound layer disposed on the package substrate, the molding compound layer including a first trench defined to surround the semiconductor chip and a second trench connected to the first trench to extend to an edge of the package substrate.

An outer wall of the package substrate may include sidewalls and edges, wherein the second trench extends from the first trench to at least one edge or at least one sidewall of the package substrate.

The first trench or the second trench may have an uneven bottom surface.

The semiconductor package device may further include a conductive pad disposed on the top surface of the package substrate, wherein at least one of the first and second trenches exposes the conductive pad.

The foregoing and/or other features and utilities of the present general inventive concept may also be achieved by providing a semiconductor package device, comprising a first package substrate including a first semiconductor chip mounted thereupon, a molding compound layer disposed on the first package substrate to house the first semiconductor chip, a second package substrate including a second semiconductor chip mounted thereupon and stacked above the first semiconductor chip, a heat transfer member disposed between a bottom surface of the second package substrate and a top surface of the first semiconductor chip, a first trench etched within the molding compound layer to surround the first semiconductor chip, and a second trench connected to the first trench to extend to an edge of the first package substrate.

The semiconductor package device may include via connection terminals to electrically and physically connect the first package substrate to the second package substrate, wherein the first trench blocks a flow of the heat transfer member into the via connection terminals adjacent to the heat transfer member.

The second trench may serve as a discharge passage to prevent the heat transfer member filled in the first trench from overflowing out of the first trench to prevent the heat transfer member from being connected to the via connection terminals.

The heat transfer member may be formed of a liquid material having a flow property in response to a rise in a temperature of the first semiconductor chip.

The semiconductor package device may further include a conductive pad formed within the first and second trenches to transfer heat from the first semiconductor chip to outside of the lower package via the heat transfer member.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
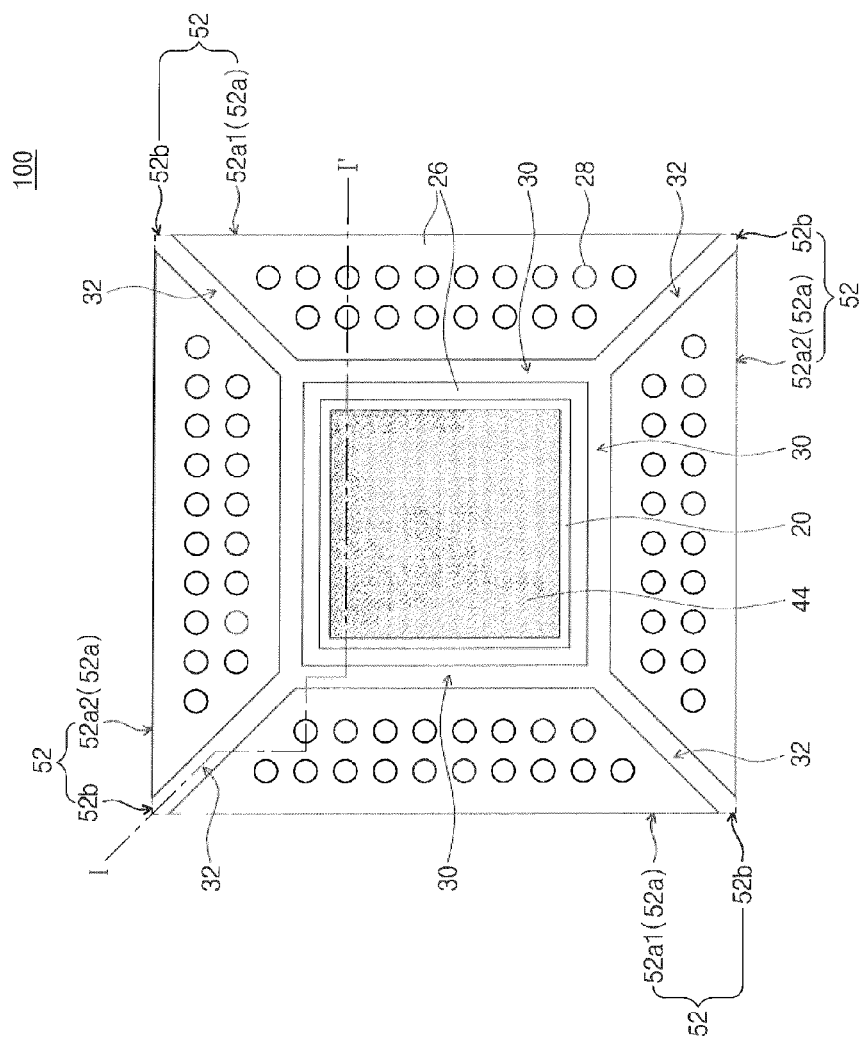
FIGS. 1A and 1B are schematic plan views of a lower package including a heat transfer member of a package on package (PoP) device according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

In the description of embodiments, it will be understood that when an element is referred to as being 'connected to' or 'coupled to', it can be directly connected to or coupled to, or intervening elements may also be present. On the other hand, in the description of embodiments, it will be understood that when an element is referred to as being 'directly connected to' or 'directly coupled to', it can not intervene elements therebetween may be present. Like reference numerals refer to like elements throughout. As used herein, the term and/or includes any and all combinations of one or more of the associated listed items.

Also, though terms like a first and a second are used to describe various elements, components, and/or sections in various exemplary embodiments of the present general inventive concept, the elements, components, and/or sections are not limited to these terms. These terms are used only to differentiate one element, component, or section from another one. Therefore, a first element, a first component, or a first section in an exemplary embodiment can be referred to as a second element, a second component, or a second section in another exemplary embodiment.

In the following description, the technical terms are used only for explain a specific exemplary embodiment while not limiting the present general inventive concept. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, exemplary embodiments of the present general inventive concept will be described in detail with reference to the accompanying drawings.

Figure 1B:
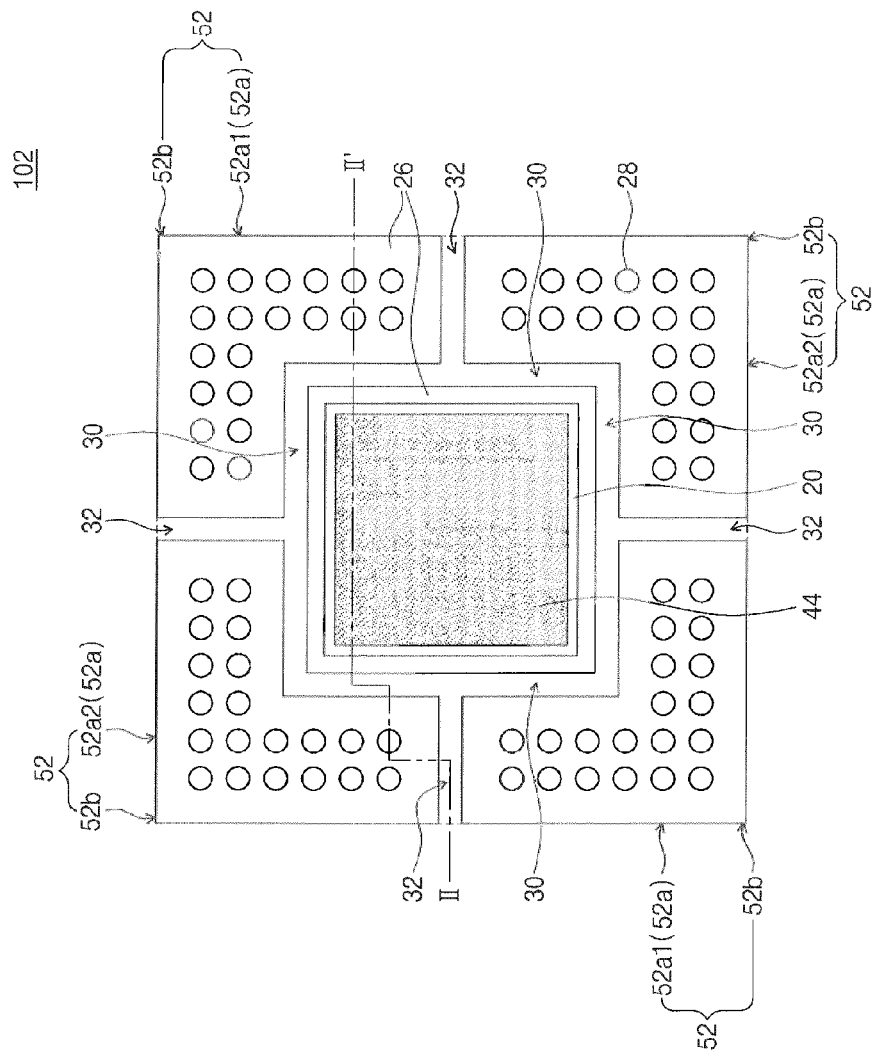

FIGS. 1A and 1B are schematic plan views of a lower package including a heat transfer member of a package on package (PoP) device according to an exemplary embodiment of the present general inventive concept.

Figure 2:
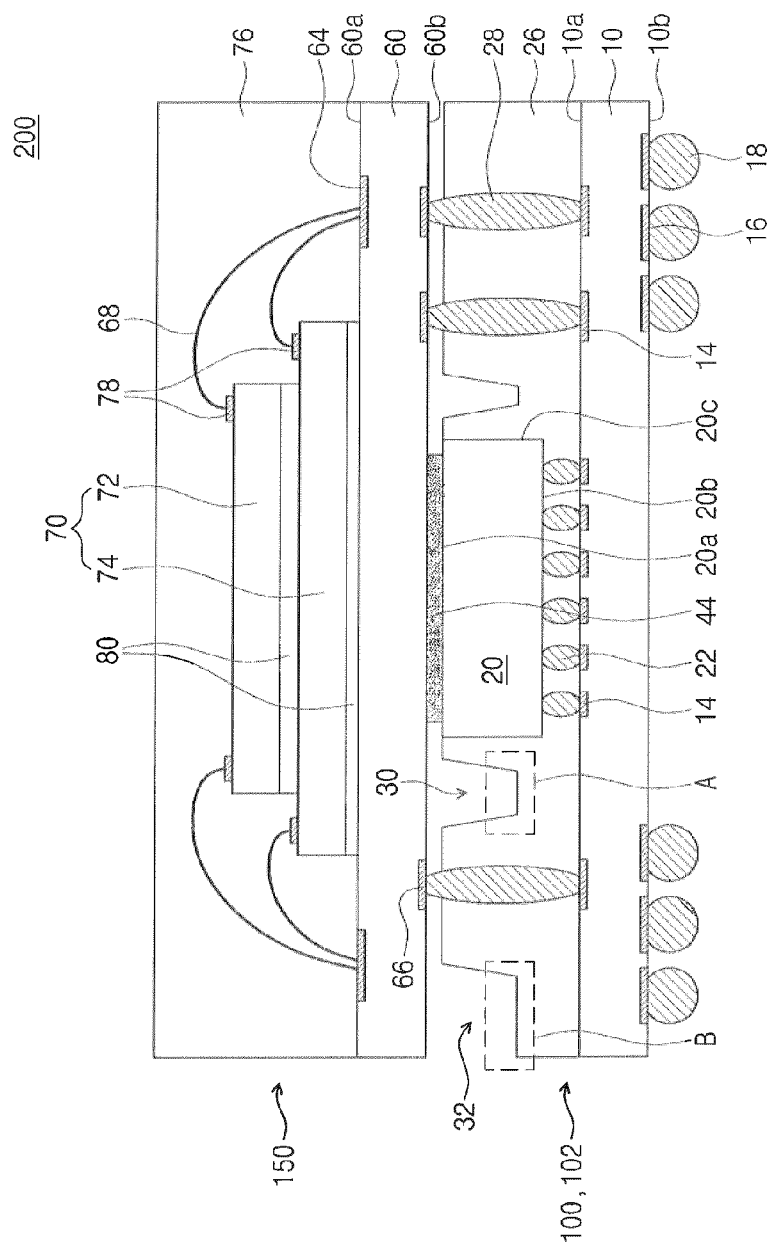
FIG. 2 is a schematic cross-sectional view illustrating an example of the PoP device according to the embodiment of the inventive concept, taken along line I-I' of FIG. 1A or line II-II' of FIG. 1B.

FIG. 2 is a schematic cross-sectional view illustrating an example of the PoP device according to an exemplary embodiment of the present general inventive concept, taken along line I-I' of FIG. 1A or line II-II' of FIG. 1B.

Referring to FIGS. 1A and 1B, and FIG. 2, a package on package (PoP) device 200 according to an exemplary embodiment of the present general inventive concept may include a lower package 100, 102, an upper package 150 disposed on the lower package 100, 102, and a heat transfer member 44 therebetween.

The lower package 100, 102 may be connected to the upper package 150 by via connection terminals 28 and may adhere to the upper package 150 by the heat transfer member 44. Thus, the lower package 100, 102 may be electrically and physically connected to the upper package 150.

The lower package 100, 102 may include an outer wall 52 including sidewalls 52a and edges 52b. In detail, the outer wall 52 may include four sidewalls 52a and four edges 52b. In more detail, the outer wall 52 may include a pair of first sidewalls 52a1 facing each other to be respectively parallel to each other, a pair of second sidewalls 52a2 facing each other to be respectively parallel to each other and perpendicular to the first sidewalls 52a1, and four edges 52b through which the first sidewalls 52a1 are connected to the second sidewalls 52a2.

As illustrated in FIG. 2, the lower package 100, 102 includes a lower package substrate 10. For example, the lower package substrate 10 may include a printed circuit board (PCB). The lower package substrate 10 may include a top surface 10a to face a bottom surface 10b thereof. First upper connection pads 14 may be disposed on the top surface 10a of the lower package substrate 10, and first lower connection pads 16 may be disposed on the bottom surface 10b of the lower package substrate 10. The first upper connection pads 14 may be electrically connected to the first lower connection pads 16 by interconnection circuits within the lower package substrate 10, respectively.

The first upper connection pads 14 may be electrically connected to chip connection terminals 22 and the via connection terminals 28. The first lower connection pads 16 may be connected to outer connection terminals 18. The outer connection terminals 18 may be electrically connected to a semiconductor module board or a system board. Each of the outer connection terminals 18 may be formed of solder material. The outer connection terminal 18 may be formed of a metal in a sphericity, mesa, or pin shape, but is not limited thereto. In this case, the metal may include copper, nickel, gold, indium, bismuth, or any other nonreactive metal, but is not limited thereto.

The lower semiconductor chip 20 is flip-chip bonded on the lower package substrate 10 so that the bottom surface 20b of the lower semiconductor chip 20 faces the top surface 10a of the lower package substrate 10, such that the bottom surface 20b is an active surface disposed adjacent to integrated circuits. The lower semiconductor chip 20 may be electrically connected to the interconnection circuits within the lower package substrate 10 through the chip connection terminals 22 and the first upper connection pads 14.

For example, each of the chip connection terminals 22 may be a solder bump. Alternatively, the chip connection terminal 22 may be a conducting bump or a conducting spacer, but is not limited thereto.

For example, the lower semiconductor chip 20 may be a logic device chip such as a microprocessor, an application processor, or a controller, but the present general inventive concept is not limited thereto.

A lower molding compound layer 26 is disposed on the top surface 10a of the lower package substrate 10. The lower molding compound layer 26 may contact a side surface 20c of the lower semiconductor chip 20 and may seal at least one portion of the side surface 20c of the lower semiconductor chip 20. The lower molding compound layer 26 may fill a space between the bottom surface 20b of the lower semiconductor chip 20 and the top surface 10a of the lower package substrate 10. A top surface of the lower molding compound layer 26 may be disposed on substantially a same plane as or a plane similar to that of the top surface 20a of the lower semiconductor chip 20. Thus, the top surface 20a of the lower semiconductor chip 20 may not be covered by the lower molding compound layer 26, but may instead be exposed.

The lower molding compound layer 26 may include a first trench 30 and a second trench 32. For example, the first and second trenches 30 and 32, respectively, may be formed by removing portions of the lower molding compound layer 26 through a laser drilled process (LDP). Alternatively, the lower molding compound layer 26 may be removed by using a general etching process to form the first and second trenches 30 and 32, respectively.

The first trench 30 may be defined in the lower molding compound layer 26 to surround the lower semiconductor chip 20. The first trench 30 may be formed between the lower semiconductor chip 20 and the via connection terminals 28 and may be spaced apart from the lower semiconductor chip 20 to surround the lower semiconductor chip 20. The first trench 30 has a depth at which the top surface 10a of the lower package substrate 10 is not exposed. The first trench 30 may have a sloped side surface profile.

Referring to FIGS. 1A and 2, the second trench 32 may be connected to the first trench 30 to extend to the outer wall 52 of the lower package 100 from the first trench 30. For example, as illustrated in FIG. 1A, the second trench 32 may include four trenches that respectively extend to the four edges 52b from the first trench 30 to contact the outside of the lower package 100. Alternatively, the second trench 32 may be one trench extending to one edge 52b. Alternatively, the second trench 32 may be trenches extending to two edges 52b or three edges 52b. Thus, at least one second trench 32 may be formed in the lower molding compound layer 26.

Referring to FIGS. 1B and 2, the second trench 32 may be connected to the first trench 30 to extend to the sidewalls 52a of the lower package 102. For example, the second trench 32 may extend to the four sidewalls 52a from the first trench 30. Alternatively, the second trench 32 may extend to one sidewall 52a, two sidewalls 52a, or three sidewalls 52a. Thus, at least one second trench 32 may be formed in the lower molding compound layer 26.

Alternatively, the second trench 32 may include trenches extending to the sidewalls 52a and the edges 52b, respectively. For example, the second trench 32 may include eight trenches extending to the four sidewalls 52a and the four edges 52b.

Alternatively, the second trench 32 may include trenches extending to two edges 52b and one to four sidewalls 52a. The second trench 32 may be capable of being modified in various shapes in addition to the foregoing shapes.

The first and second trenches 30 and 32, respectively, of the lower package 100, 102 may have substantially same or different depths from each other. The first trench 30 may have a depth greater or less than that of the second trench 32. The first and second trenches 30 and 32, respectively, may have substantially the same upper width or upper widths different from each other. The first trench 30 may have an upper width greater or less than that of the second trench 32.

The second trench 32 may have different upper widths at the upper portions at which the second trench 32 is connected to the first trench 30 and is disposed adjacent to the edges 52b or the sidewalls 52a.

The upper package 150 of the PoP device 200 may include an upper package substrate 60. The upper package substrate 60 may include a printed circuit board (PCB). The upper package substrate 60 may include a top surface 60a to face a bottom surface 60b thereof. Second upper connection pads 64 may be disposed on the top surface 60a of the upper package substrate 60, and second lower connection pads 66 may be disposed on the bottom surface 60b of the upper package substrate 60. The second connection upper pads 64 may be electrically connected to bonding wires 68. The second connection lower pads 66 may be connected to the via connection terminals 28.

The upper semiconductor chip 70 may be mounted on the upper package substrate 60. The upper semiconductor chip 70 may include at least one semiconductor chip. In the upper semiconductor chip 70, one or more semiconductor chips may be disposed in parallel, or a plurality of semiconductor chips may be stacked on each other. For example, FIG. 2 illustrates an example of a structure in which the first and second semiconductor chips 72 and 74 are stacked on each other. The upper semiconductor chip 70 may include a memory chip such as dynamic random access memory (DRAM), FLASH MEMORY, magnetoresistive random access memory (MRAM), phase change random access memory (PRAM), resistive random access memory (ReRAM), or static random access memory (SRAM), but is not limited thereto. The first and second semiconductor chips 72 and 74 may respectively adhere to the upper package substrate 60 and the first semiconductor chip 72, by the adhesives 80 between the first semiconductor chip 72 and the second semiconductor chip 74 and between the first semiconductor chip 72 and the upper package substrate 60. The upper semiconductor chip 70 may be electrically connected to the second upper connection pads 64 on the upper package substrate 60 by the bonding wires 68 connected to the chip pads 78 on the upper surface of the upper semiconductor chip 70. Alternatively, the upper semiconductor chip 70 may be connected to the upper package substrate 60 by flip chip bonding, similar to the lower semiconductor chip 20. The upper molding compound layer 76 may be disposed on the top surface 60a of the upper package substrate 60 to seal the upper semiconductor chip 70. The second upper and lower connection pads 64 and 66 of the upper package substrate 60 may be electrically connected to each other by the interconnection circuits within the upper package substrate 60.

The via connection terminals 28 may connect the lower package 100, 102 and the upper package 150 of the PoP device 200 to each other. In detail, the via connection terminals 28 may be connected to the first upper connection pads 14 on the top surface 10a of the lower package substrate 10 of the lower package 100, 102 and the second lower connection pads 66 on the bottom surface 60b of the upper package substrate 60 of the upper package 150. A signal generated from an external system or the lower semiconductor chip 20 may be transmitted to the upper semiconductor chip 70 of the upper package 150 through the via connection terminal 28. The via connection terminals 28 may be spaced apart from the lower semiconductor chip 20 and disposed within the lower molding compound layer 26.

The heat transfer member 44 may be disposed between the bottom surface 60b of the upper package substrate 60 and the top surface 20a of the lower semiconductor chip 20. The top surface 20a of the lower semiconductor chip 20 may be a non-active surface that is not disposed adjacent to the integrated circuits, unlike the bottom surface 20b. For example, the heat transfer member 44 may be formed of thermal grease or a material in which metal particles such as indium are contained in an epoxy material, but is not limited thereto. Also, the heat transfer member 44 may have an adhesion function and/or conductivity. The heat transfer member 44 may be formed of a liquid material having a flow property when the temperature rises so as to prevent the lower semiconductor chip 20 from being bent. If the lower semiconductor chip 20 is a logic chip such as a microprocessor, a large amount of heat may be generated during an operation of system control and/or various functions. Due to the heat generation, the heat transfer member 44 may be liquefied to flow freely within at least some portions of the PoP device 200. Thus, the heat transfer member 44 may flow into the via connection terminals 28 adjacent to the side surface 20c of the lower semiconductor chip 20 to electrically connect the via connection terminals 28 to each other. Thus, when the signal is transmitted between the lower semiconductor chip 20 and the upper semiconductor chip 70 of the upper package 150, a limitation may occur to deteriorate reliability of the PoP device 200. However, to prevent the above-described limitation from occurring, the first trench 30 may be formed to surround the lower semiconductor chip 20 on which the heat transfer member 44 is disposed, thereby blocking a flow of the heat transfer member 44 into the via connection terminals 28 adjacent to the heat transfer member 44. Furthermore, the second trench 32 serving as a discharge passage so that the heat transfer member 44 filled in the first trench 30 does not overflow out of the first trench 30 may be connected to the first trench 30 to prevent the heat transfer member 44 from being connected to the via connection terminals 28. Thus, interference between the via connection terminals 28 due to the heat transfer member 44 may be prevented to allow the signal to be efficiently transmitted between the upper semiconductor chip 70 and the lower semiconductor chip 20 that are included in the package, thereby improving reliability of PoP device 200.

Figure 3:
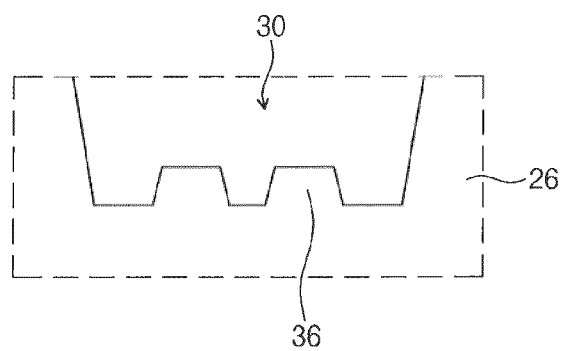
FIG. 3 is a schematic exploded view of a portion A in FIG. 2 according to an exemplary embodiment of the present general inventive concept.
Figure 4:
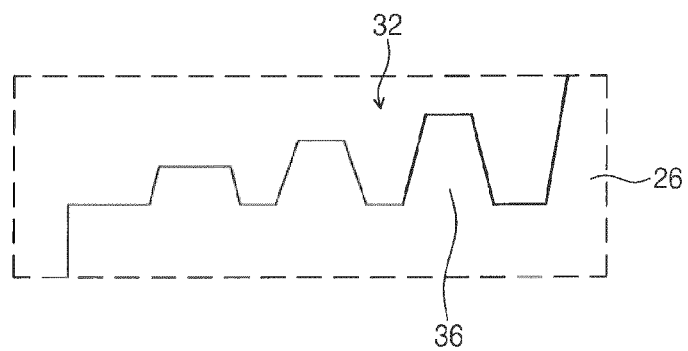
FIG. 4 is a schematic exploded view of a portion B in FIG. 2 according to an exemplary embodiment of the present general inventive concept.

Referring to FIGS. 3 and 4 that are enlarged views of portions A and B of FIG. 2, the first trench 30 or the second trench 32 in FIG. 2 may have an uneven bottom surface. At least one stopper 36 to block a flow of a material may be disposed on the bottom surface of each of the first and second trenches 30 and 32, respectively, to prevent the heat transfer member 44 with fluidity from overflowing out of the first and second trenches 32. The stoppers 36 on the bottom surface of the first trench 30 may have substantially the same height, as illustrated in FIG. 3. Alternatively, the stoppers 36 may have different heights, as illustrated in FIG. 4. That is, the stoppers 36 on the bottom surface of the second trench 32 may have heights gradually decreasing from the portion connected to the first trench 30 toward the outer wall 52 of the lower package 100, 102. Alternatively, the stoppers 36 of the second trench 32 may have substantially the same height.

Figure 5:
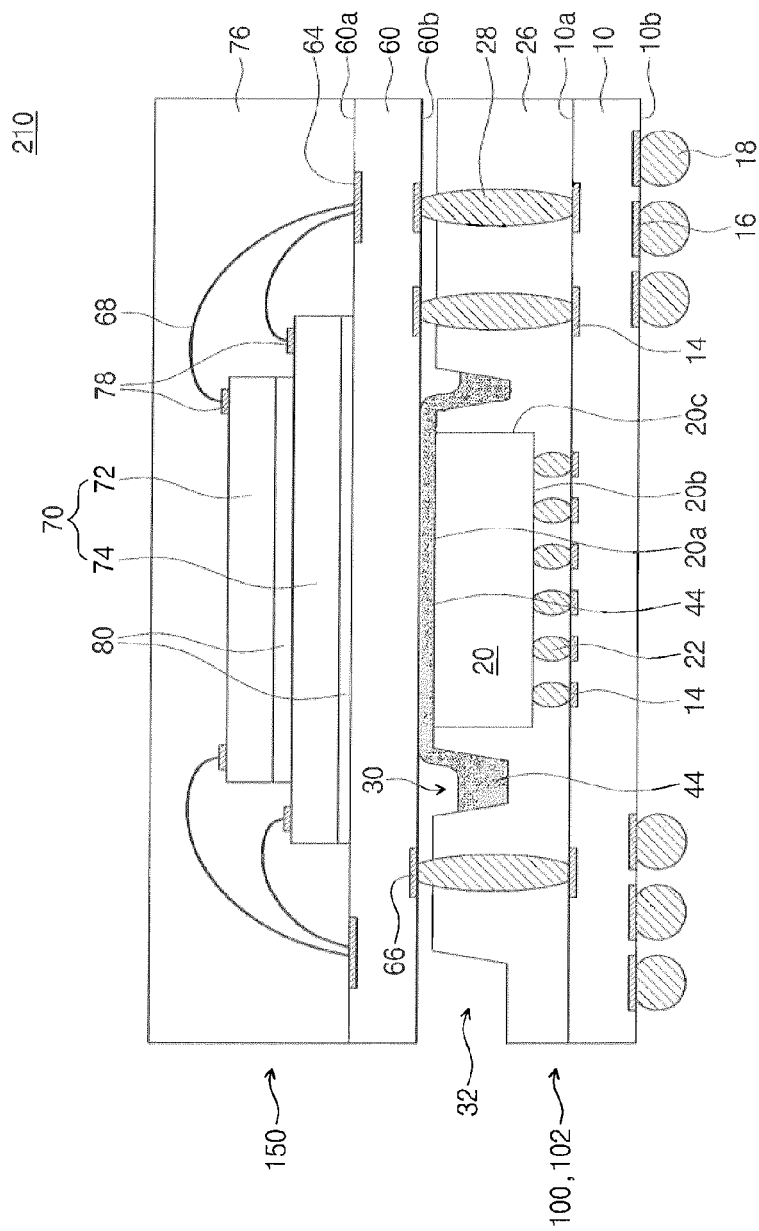
FIGS. 5 through 12 are schematic cross-sectional views illustrating a modified example of the PoP device according to various exemplary embodiments of the present general inventive concept.

FIG. 5 is a schematic cross-sectional view illustrating a modified example of the PoP device 210 according to the exemplary embodiment of the present general inventive concept.

Referring to FIG. 5, a modified PoP device 210 according to an exemplary of the present general inventive concept may include similar components as the PoP device 200 described with reference to FIGS. 2 through 4, with an exception of a configuration of the heat transfer member 44. Hereinafter, only differences therebetween will be described.

The heat transfer member 44 may be disposed between the bottom surface 60b of the upper package substrate 60 and the top surface 20a of the lower semiconductor chip 20 and be further disposed in the first trench 30. The heat transfer member 44 may be further expanded from the top surface of the lower semiconductor chip to the top surface of the lower molding compound layer 26 adjacent thereto to improve heat transfer efficiency. The heat transfer member 44 may also be disposed in the first trench 30. The heat transfer member 44 may be sufficiently provided on the top surface 20a of the lower semiconductor chip 20 to fill at least one portion of the first trench 30. Alternatively, the heat transfer member 44 on the lower semiconductor chip 20 may flow into the first trench 30 due to heat generated while the lower semiconductor chip 20 is operated, and thus the heat transfer member 44 may fill at least one portion of the first trench 30.

Figure 6:
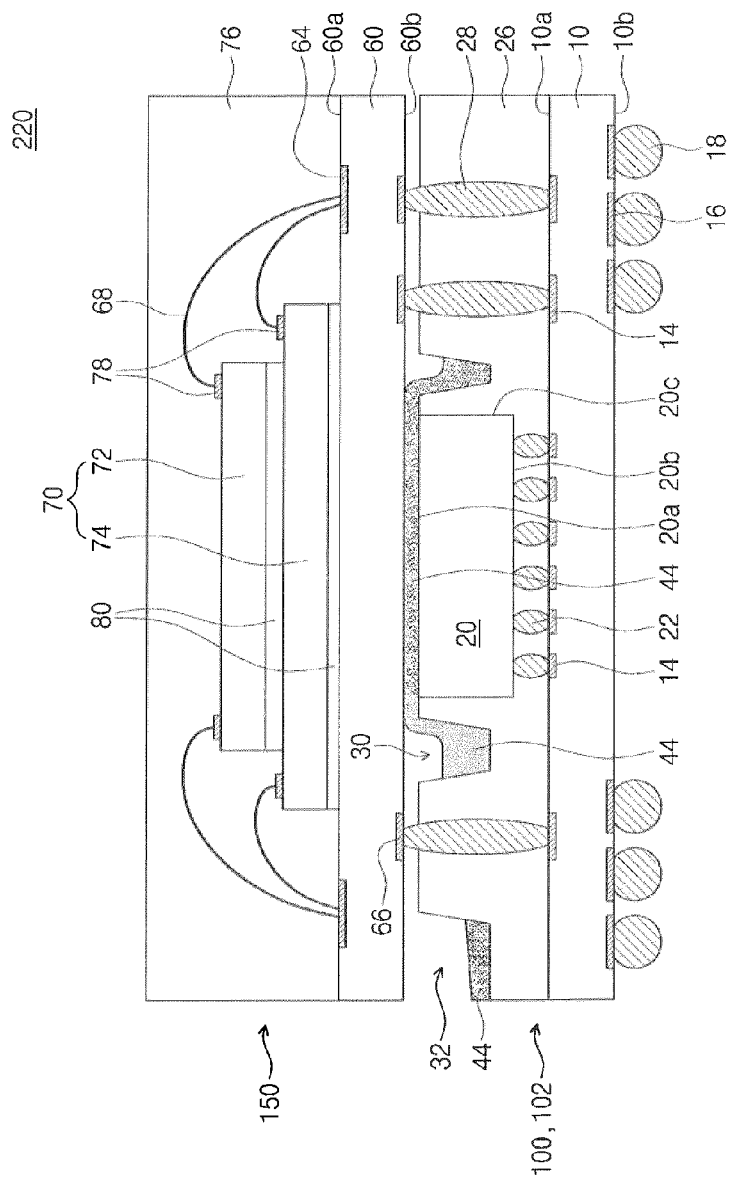

FIG. 6 is a schematic cross-sectional view illustrating a modified example of the PoP device 220 according to an exemplary embodiment of the present general inventive concept.

Referring to FIG. 6, the modified PoP device 220 according to an exemplary embodiment of the present general inventive concept may include similar components as the PoP device 200 described with reference to FIGS. 2 through 4 with an exception of a configuration of the heat transfer member 44. Hereinafter, only differences therebetween will be described.

The heat transfer member 44 may be disposed between the bottom surface 60b of the upper package substrate 60 and the top surface 20a of the lower semiconductor chip 20 and be further disposed in the first and second trenches 30 and 32, respectively. The heat transfer member 44 may be further expanded from the top surface of the lower semiconductor chip to the top surface of the lower molding compound layer 26 adjacent thereto to improve heat transfer efficiency. The heat transfer member 44 may also be disposed in the first and second trenches 30 and 32, respectively. The heat transfer member 44 may be sufficiently provided on the top surface 20a of the lower semiconductor chip 20 to fill at least one portion of each of the first and second trenches 30 and 32, respectively. Alternatively, the heat transfer member 44 on the lower semiconductor chip 20 may flow into the first trench 30 due to heat generated while the lower semiconductor chip 20 is operated, and thus the heat transfer member 44 may fill at least one portion of each of the first and second trenches 30 and 32, respectively.

Figure 7:
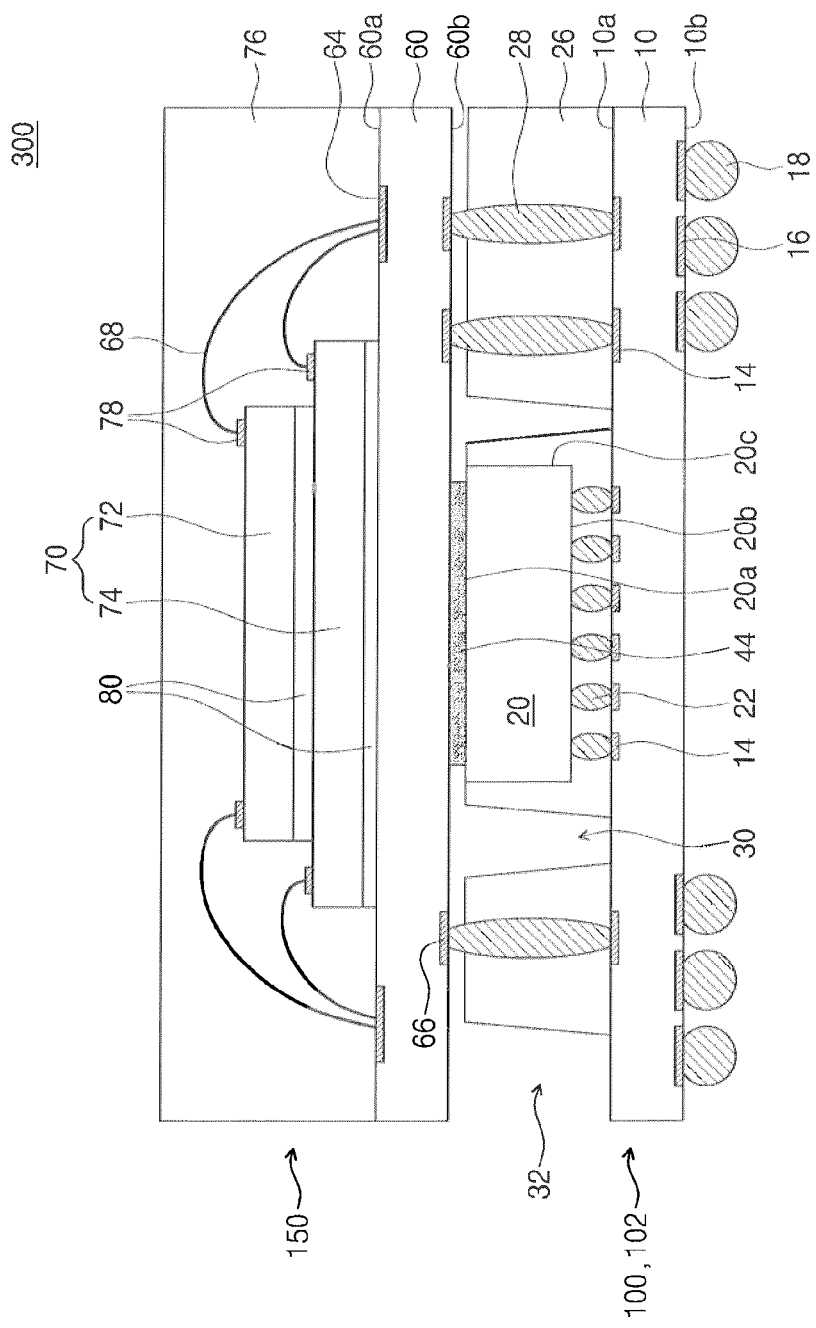

FIG. 7 is a schematic cross-sectional view illustrating a modified example of the PoP device 300 according to an exemplary embodiment of the present general inventive concept.

Referring to FIG. 7, the modified PoP device 300 according to an exemplary embodiment of the present general inventive concept may include similar components as the PoP device 200 described with reference to FIGS. 2 through 4 with an exception of a structural difference due to depths of the first and second trenches 30 and 32, respectively. Hereinafter, only differences therebetween will be described.

The first and second trenches 30 and 32, respectively, may be formed by removing portions of the lower molding compound layer 26 to expose the top surface 10a of the lower package substrate 10. Alternatively, only one of the first and second trenches 30 and 32, respectively, may expose the top surface 10a of the lower package substrate 10. For example, the top surface 10a of the lower package 10 may be exposed by the second trench 32 and may not be exposed by the first trench 30. On the other hand, the top surface 10a of the lower package substrate 10 may be exposed by the first trench 30 and may not be exposed by the second trench 32. Thus, at least one of the first and second trenches 30 and 32, respectively, may expose the top surface 10a of the lower package substrate 10. The first and second trenches 30 and 32, respectively, may have bottom surfaces that correspond to the top surface 10a of the lower package substrate 10 on which the stopper 36 illustrated in FIGS. 3 and 4 is not disposed.

Figure 8:
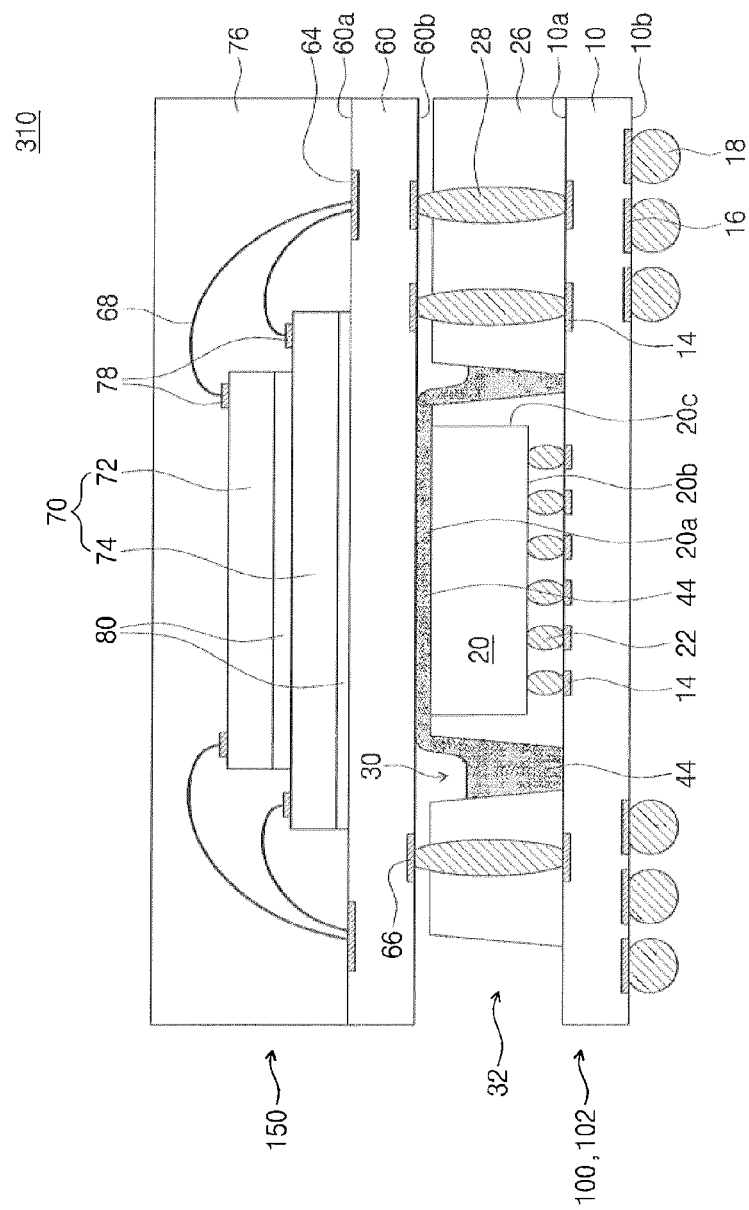

FIG. 8 is a schematic cross-sectional view illustrating a modified example of the PoP device 310 according to an exemplary embodiment of the present general inventive concept.

Referring to FIG. 8, the modified PoP device 310 according to an exemplary embodiment of the present general inventive concept may include similar components as the PoP device 210 described with reference to FIG. 5 with an exception of a structural difference due to depths of the first and second trenches 30 and 32, respectively. Hereinafter, only differences therebetween will be described.

The heat transfer member 44 may be disposed between the bottom surface 60b of the upper package substrate 60 and the top surface 20a of the lower semiconductor chip 20 and be further disposed in the first trench 30. The heat transfer member 44 may be further expanded from the top surface of the lower semiconductor chip to the top surface of the lower molding compound layer 26 adjacent thereto to improve heat transfer efficiency. The heat transfer member 44 may also be disposed in the first trench 30. The heat transfer member 44 may contact the top surface 10a of the lower package substrate 10. The heat transfer member 44 of the PoP device 310 according to another exemplary embodiment of the present general inventive concept may be formed through the same method as the heat transfer member 44 of the PoP 210 described with reference to FIG. 5.

Figure 9:
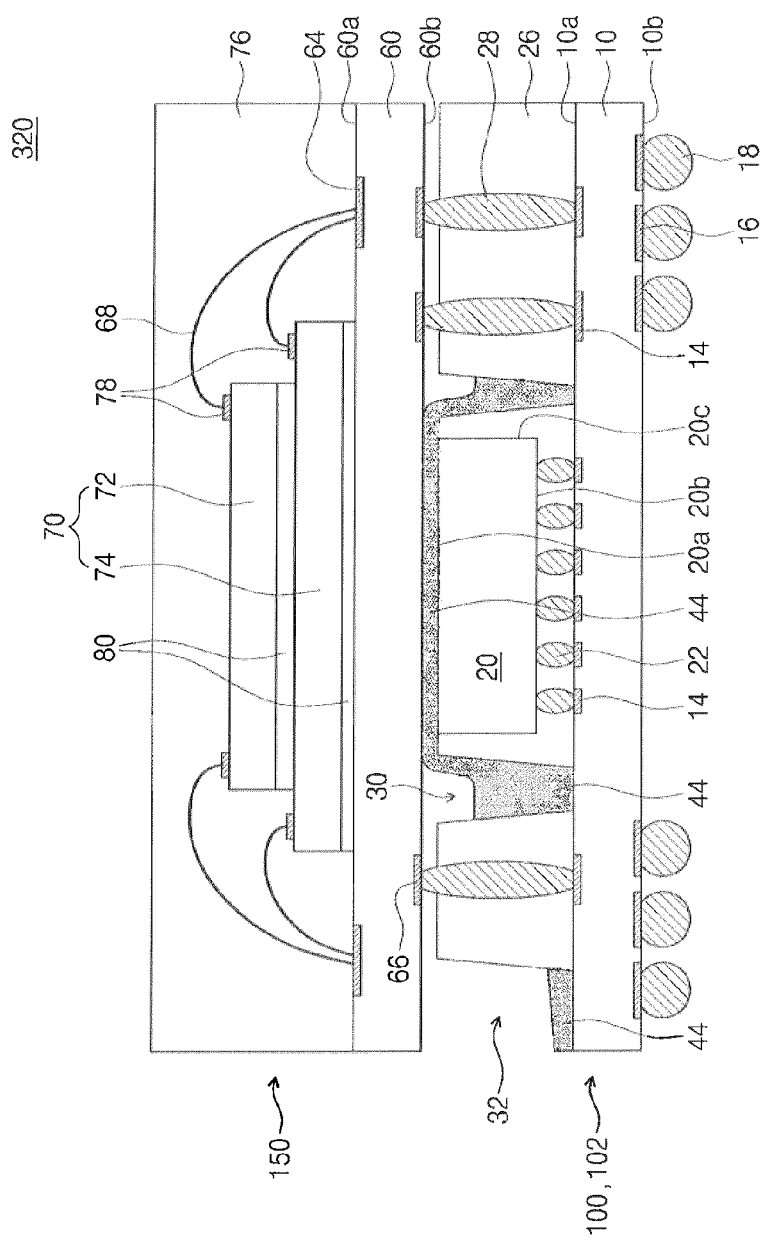

FIG. 9 is a schematic cross-sectional view illustrating a modified example of the PoP device 320 according to the exemplary embodiment of the present general inventive concept.

Referring to FIG. 9, a modified PoP device 320 according to an exemplary embodiment of the inventive concept may include similar components as the PoP device 220 described with reference to FIG. 6 with an exception of a structural difference due to depths of the first and second trenches 30 and 32, respectively. Hereinafter, only differences therebetween will be described.

The heat transfer member 44 may be disposed between the bottom surface 60b of the upper package substrate 60 and the top surface 20a of the lower semiconductor chip 20, and further disposed in the first and second trenches 30 and 32, respectively. The heat transfer member 44 may be further expanded from the top surface 20a of the lower semiconductor chip to adjacent top surface of the lower molding compound layer 26 to improve heat transfer efficiency. The heat transfer member 44 may be disposed in the first and second trenches 30 and 32, respectively. The heat transfer member 44 may contact the top surface 10a of the lower package substrate 10. The heat transfer member 44 of the PoP device 320 according to another exemplary embodiment of the present general inventive concept may be formed through the same method as the heat transfer member 44 of the PoP 220 described with reference to FIG. 6. As the heat transfer member 44 is disposed in the trench 32, heat generated while the lower semiconductor chip 20 is operated can be released to the outside through the outer wall 52 of the lower package 100, 102.

Figure 10:
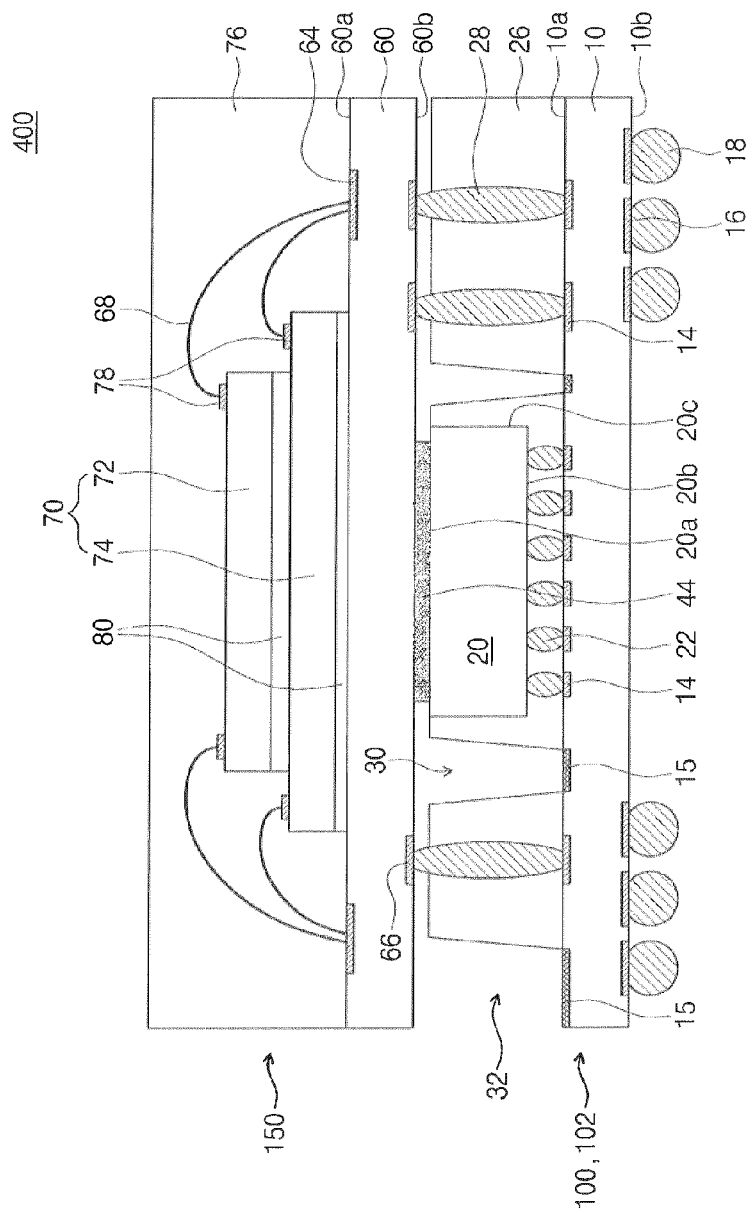

FIG. 10 is a schematic cross-sectional view illustrating a modified example of the PoP device 400 according to an exemplary embodiment of the present general inventive concept.

Referring to FIG. 10, a modified PoP device 400 according to an exemplary embodiment of the present general inventive concept may include similar components as the PoP device 300 described with reference to FIG. 7 with an exception of conductive pads 15 exposed to the first and second trenches 30 and 32, respectively. Hereinafter, only differences therebetween will be described.

The conductive pad 15 may be disposed on the top surface 10a of the lower package substrate 10. The conductive pad 15 may have the same shape as the first and second trenches 30 and 32, respectively. For example, the conductive pad 15 may have the same shape as the first and second trenches 30 and 32, respectively, illustrated in FIGS. 1a and 1b, in that the conductive pad 15 surrounds the lower semiconductor chip 20 and extends toward the outer wall 50a. Alternatively, the conductive pad 15 may be sequentially disposed on the bottom portion of the first and second trenches 30 and 32, respectively, in an island shape. The conductive pad 15 may have a width the same as, or different from that of the bottom portion of each of the first and second trenches 30 and 32, respectively. The conductive pad 15 may have a width greater, or less than that of the bottom portion of each of the first and second trenches 30 and 32, respectively. The conductive pad 15 may be formed of a metal material. A conductive layer may be further disposed on the conductive pad 15.

Figure 11:
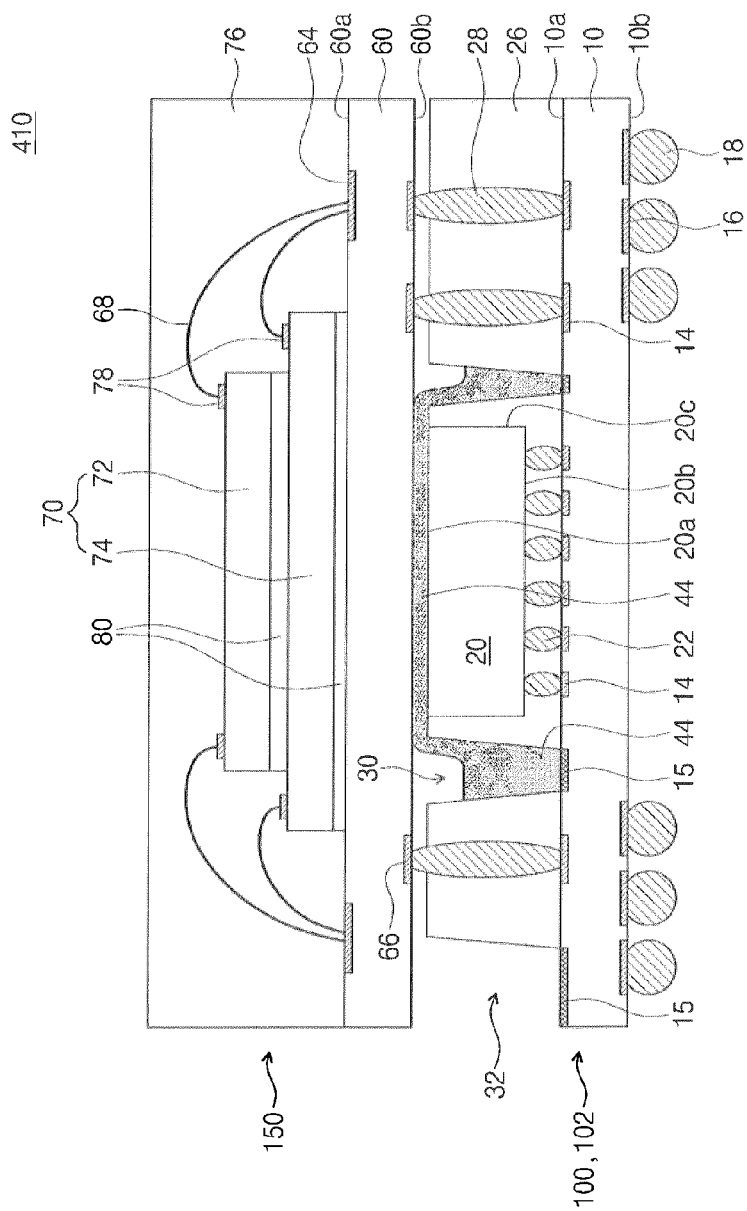

FIG. 11 is a schematic cross-sectional view illustrating a modified example of the PoP device 410 according to an exemplary embodiment of the present general inventive concept.

Referring to FIG. 11, the modified PoP device 410 according to an exemplary embodiment of the present general inventive concept may include similar components as the PoP device 310 described with reference to FIG. 8 with an exception of a conductive pad 15 exposed to the first and second trenches 30 and 32, respectively. Hereinafter, only differences therebetween will be described.

The heat transfer member 44 may be disposed between the bottom surface 60b of the upper package substrate 60 and the top surface 20a of the lower semiconductor chip 20 and be further disposed in the first trench 30. The heat transfer member 44 may be further expanded from the top surface of the lower semiconductor chip to the top surface of the lower molding compound layer 26 adjacent thereto to improve heat transfer efficiency. The heat transfer member 44 may also be disposed in the first trench 30. The heat transfer member 44 may contact the conductive pad 15 in the lower package substrate 10. The heat transfer member 44 of the PoP device 410 according to another exemplary embodiment of the present general inventive concept may be formed through the same method as the heat transfer heat 44 of the PoP 310 described with reference to FIG. 8. Since the conductive pad 15 may be formed of a metal material to improve heat transfer efficiency, heat generated from the lower semiconductor chip 20 can be released outside of the lower package 100, 102 by the heat transfer member 44 and the lower conductive pad 15.

Figure 12:
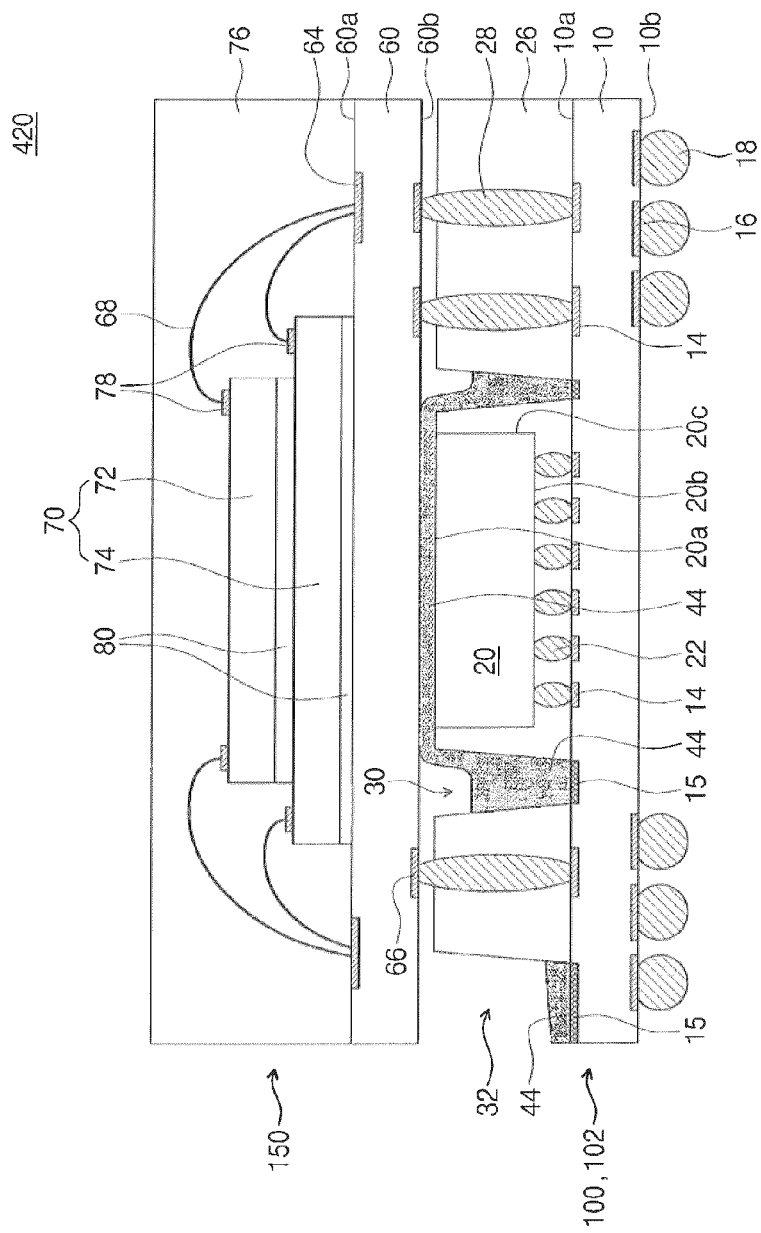

FIG. 12 is a schematic cross-sectional view illustrating a modified example of the PoP device 420 according to an exemplary embodiment of the present general inventive concept.

Referring to FIG. 12, the modified PoP device 420 according to an exemplary embodiment of the present general inventive concept may include similar components as the PoP device 320 described with reference to FIG. 9 with an exception of a conductive pad 15 exposed to the bottom portion of each of the first and second trenches 30 and 32, respectively. Hereinafter, only differences therebetween will be described.

The heat transfer member 44 may be disposed between the bottom surface 60b of the upper package substrate 60 and the top surface 20a of the lower semiconductor chip 20, and further disposed in the first and second trenches 30 and 32, respectively. The heat transfer member 44 may be further expanded from the top surface 20a of the lower semiconductor chip 20 to adjacent top surface of the lower molding compound layer 26 to improve heat transfer efficiency. The heat transfer member 44 may be disposed in the first and second trenches 30 and 32, respectively. The heat transfer member 44 may contact the conductive pad 15 in the lower package substrate 10. Alternatively, the heat transfer member 44 may contact the conductive pad 15 in the first trench 30 in case where the conductive pad 15 is exposed by the first trench 30 and is not exposed by the second trench 32. Alternatively, the heat transfer member 44 may contact the conductive pad 15 in the second trench 32 in case where the conductive pad 15 is exposed by the second trench 32 and is not exposed by the first trench 30. Therefore, the heat transfer member 44 may contact the conductive pad 15 disposed on the top surface 10a of the lower package substrate 10 exposed by at least one trench of the first and second trenches 30 and 32, respectively. The heat transfer member 44 of the PoP device 420 according to another exemplary embodiment of the present general inventive concept formed through the same method as the heat transfer member 44 of the PoP device 320 described with reference to FIG. 9. Since the conductive pad 15 may be formed of a metal material to improve heat transfer efficiency, heat generated from the lower semiconductor chip 20 can be more effectively released outside of the lower package 100, 102 by the heat transfer member 44 and the lower conductive pad 15.

Figure 13A:
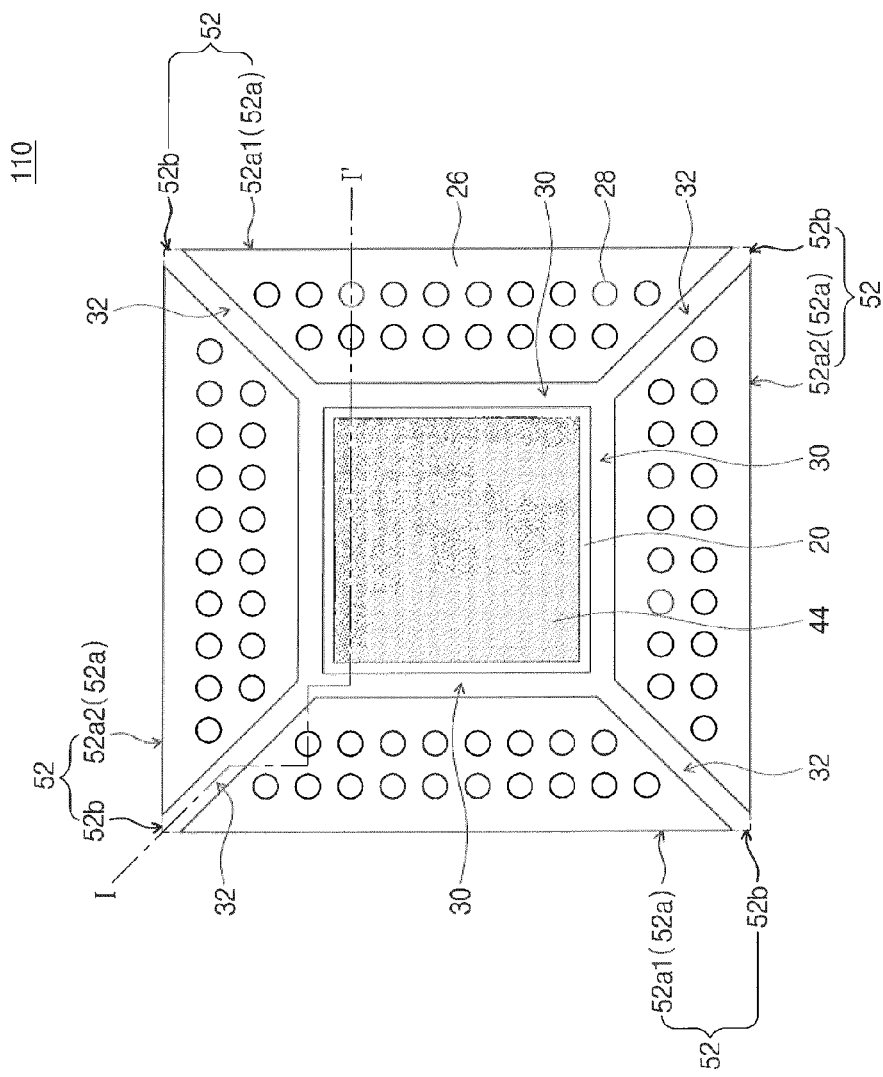
FIGS. 13A and 13B are schematic plan views of a lower package of a PoP device according to another exemplary embodiment of the present general inventive concept.
Figure 13B:
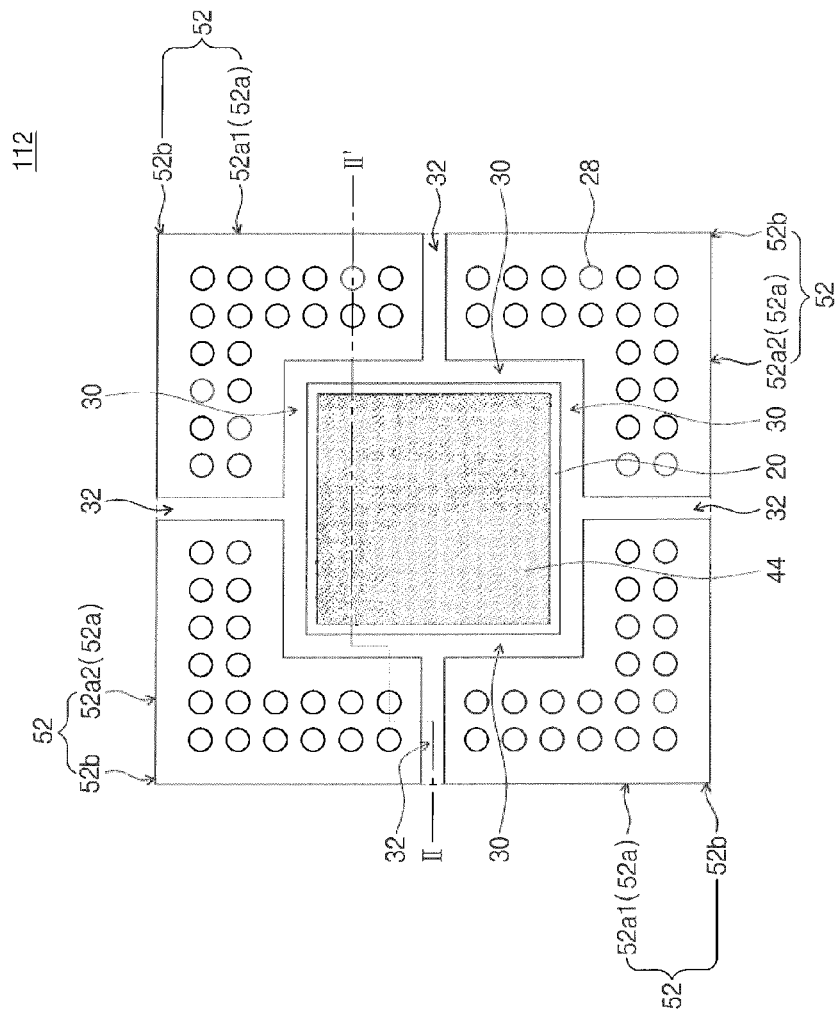
Figure 14:
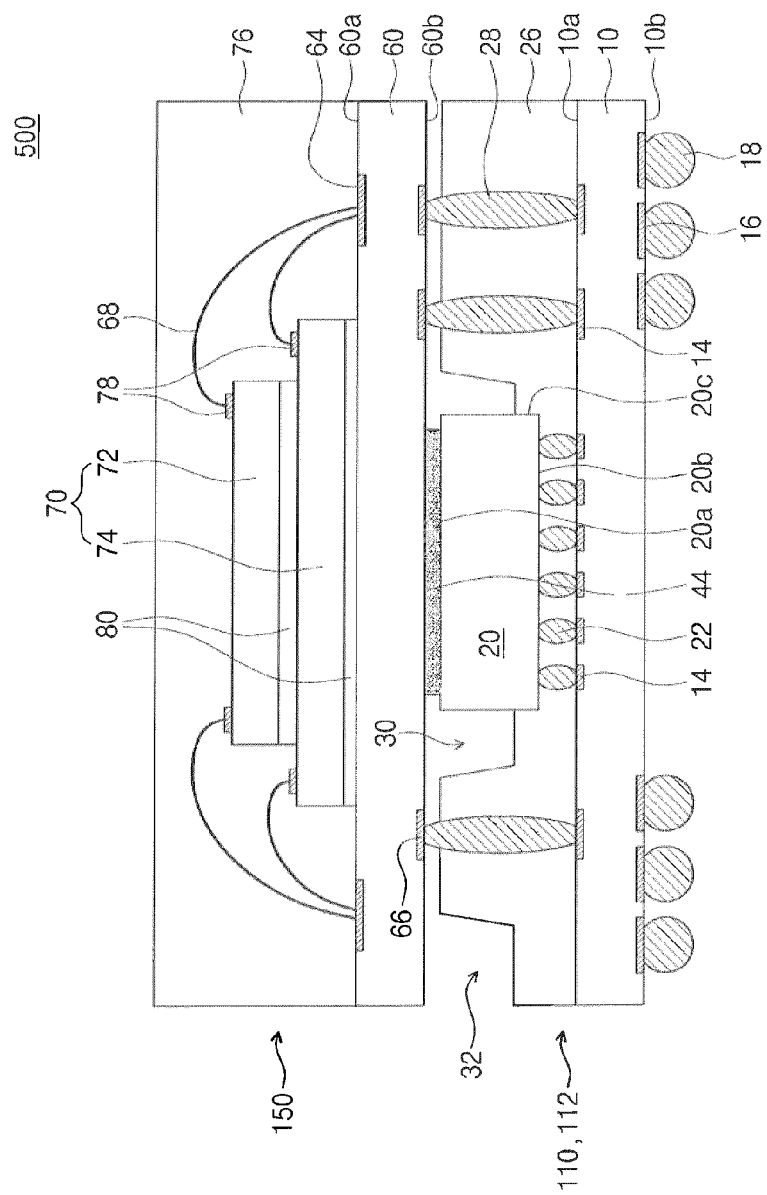
FIGS. 14 through 17 are schematic cross-sectional views illustrating a modified example of the PoP device according to various exemplary embodiments of the present general inventive concept, taken along line I-I' of FIG. 13A or line II-II' of FIG. 13B.

FIGS. 13A and 13B are schematic plan views of a lower package of a PoP device according to another exemplary embodiment of the present general inventive concept;

FIG. 14 is a schematic cross-sectional view illustrating a modified example of the PoP device according to another exemplary embodiment of the present general inventive concept, taken along line I-I' of FIG. 13A or line II-II' of FIG. 13B;

Referring to FIGS. 13A, 13B and 14, the modified PoP device 500 according to another exemplary embodiment of the present general inventive concept may include similar components as the PoP device 200 described with reference to FIGS. 2 through 4 with an exception of a configuration of the first trench 30. Hereinafter, only differences therebetween will be described.

A first trench 30 may be formed in a lower molding compound layer 26 to expose a portion of the side surface of a lower semiconductor chip 20 and to surround the lower semiconductor chip 20. For example, the first trench 30 may be formed by removing a portion of the lower molding compound layer 26 by using a laser drilled process (LDP) or a general etching process. As shown in FIGS. 13A and 13B, a second trench 32 may include trenches connected to the first trench 30 to extend from the first trench 30 to four edges 52b of a lower package 110 or four sidewalls 52a of a lower package 112. Alternatively, the second trench 32 may include trenches connected to the first trench 30 and extend at least one edge 52b of the lower package 110 or at least one sidewall 52a of the lower package 112 from the first trench 30.

Figure 15:
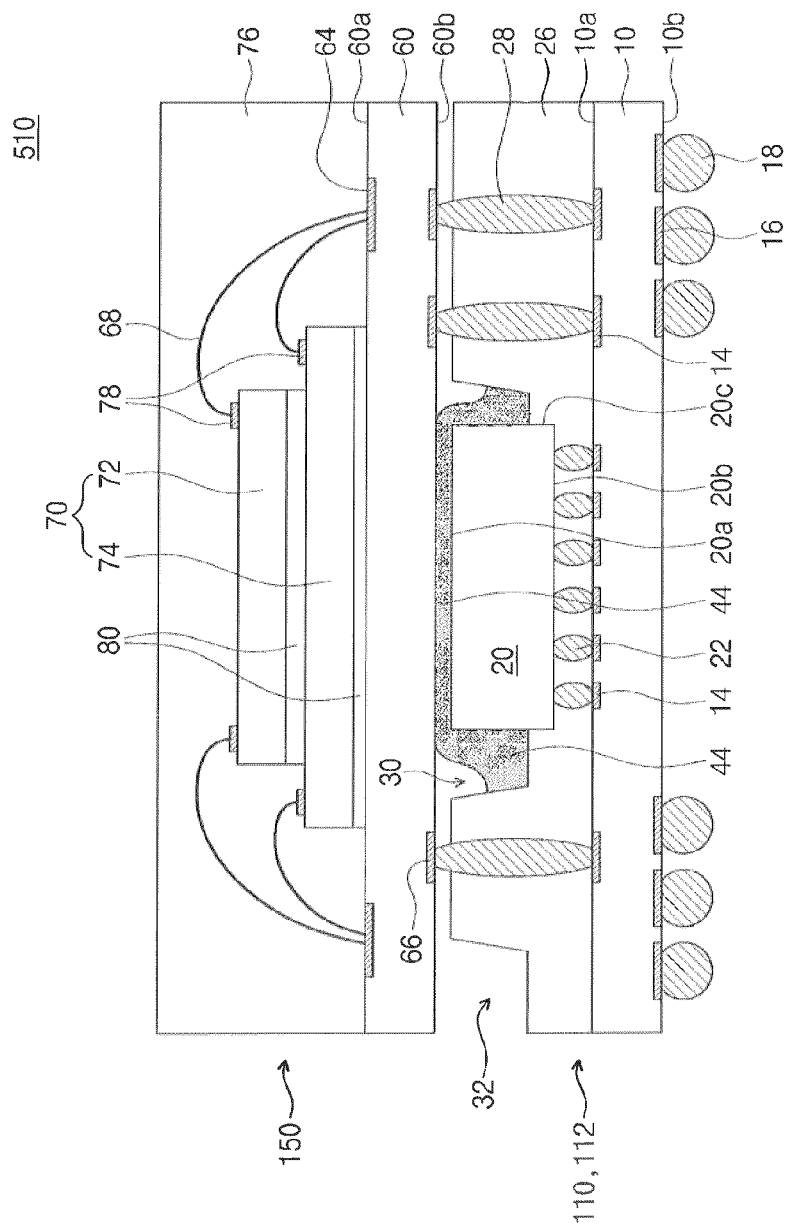

FIG. 15 is a schematic cross-sectional view illustrating a modified example of a PoP device 510 according to another exemplary embodiment of the present general inventive concept.

Referring to FIGS. 13A, 13B and 15, the modified PoP device 510 according to another exemplary embodiment of the present general inventive concept may include similar components as the PoP device 210 described with reference to FIG. 5 with an exception of a configuration of the first trench 30. Hereinafter, only differences therebetween will be described.

A heat transfer member 44 may be disposed between a bottom surface 60b of an upper package substrate 60 and a top surface 20a of the lower semiconductor chip 20 and further disposed in the first trench 30 to contact a side surface 20c of the lower semiconductor chip 20. The heat transfer member 44 may be disposed on the top surface 20a of the lower semiconductor chip 20 and to surround the side surface 20c exposed by the first trench 30 to improve heat transfer efficiency. The heat transfer member 44 of the PoP device 510 according to another exemplary embodiment of the present general inventive concept may be formed through the same method as the heat transfer member 44 of the PoP device 210 described with reference to FIG. 5. The heat transfer member 44 may increase the contact area with the lower semiconductor chip 20, thereby improving heat release efficiency with respect to heat generated from the lower semiconductor chip 20.

Figure 16:
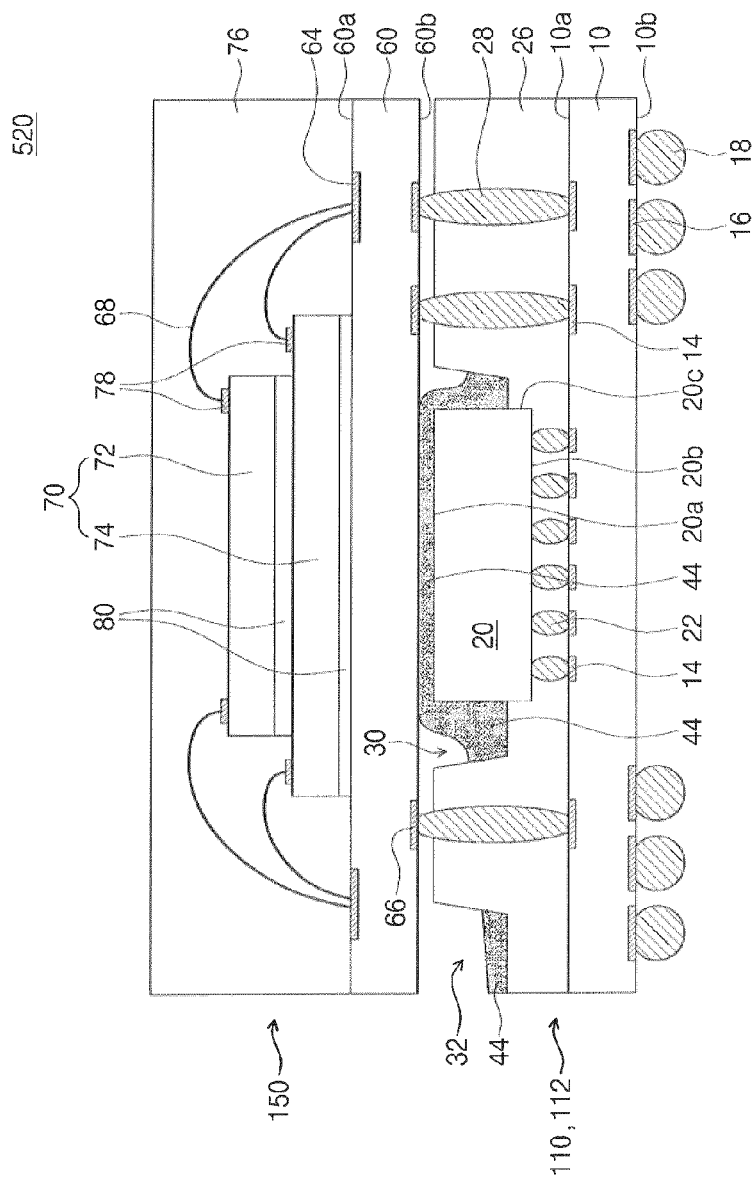

FIG. 16 is a schematic cross-sectional view illustrating a modified example of the PoP device 520 according to another exemplary embodiment of the present general inventive concept.

Referring to FIGS. 13A, 13B and 16, the modified PoP device 520 according to another exemplary embodiment of the present general inventive concept may include similar components as the PoP device 220 described with reference to FIG. 6 with an exception of a configuration of the first trench 30. Hereinafter, only differences therebetween will be described.

The heat transfer member 44 may be disposed between the bottom surface 60b of the upper package substrate 60 and the top surface 20a of the lower semiconductor chip 20 and further disposed in the first and second trenches 30 and 32, respectively. In order to improve heat transfer efficiency, the heat transfer member 44 may be disposed on the top surface 20a of the lower semiconductor chip 20. Also, the heat transfer member 44 may be formed in the first trench 30 to contact and surround the side surface 20c. The heat transfer member 44 may be further disposed in the second trench 32 to extend toward the outer wall 52 of the lower package 110, 112, thereby being exposed outside of the lower package 110, 112. The heat transfer member 44 of the PoP device 520 according to another exemplary embodiment of the present general inventive concept may be formed through the same method as the heat transfer member 44 of the PoP device 220 described with reference to FIG. 6. Since heat generated from the lower semiconductor chip 20 may be released through an upper package 150 and the outer wall 52 of the lower package 110, 112, heat release efficiency to the outside of the lower package 110, 112 can be improved.

Figure 17:
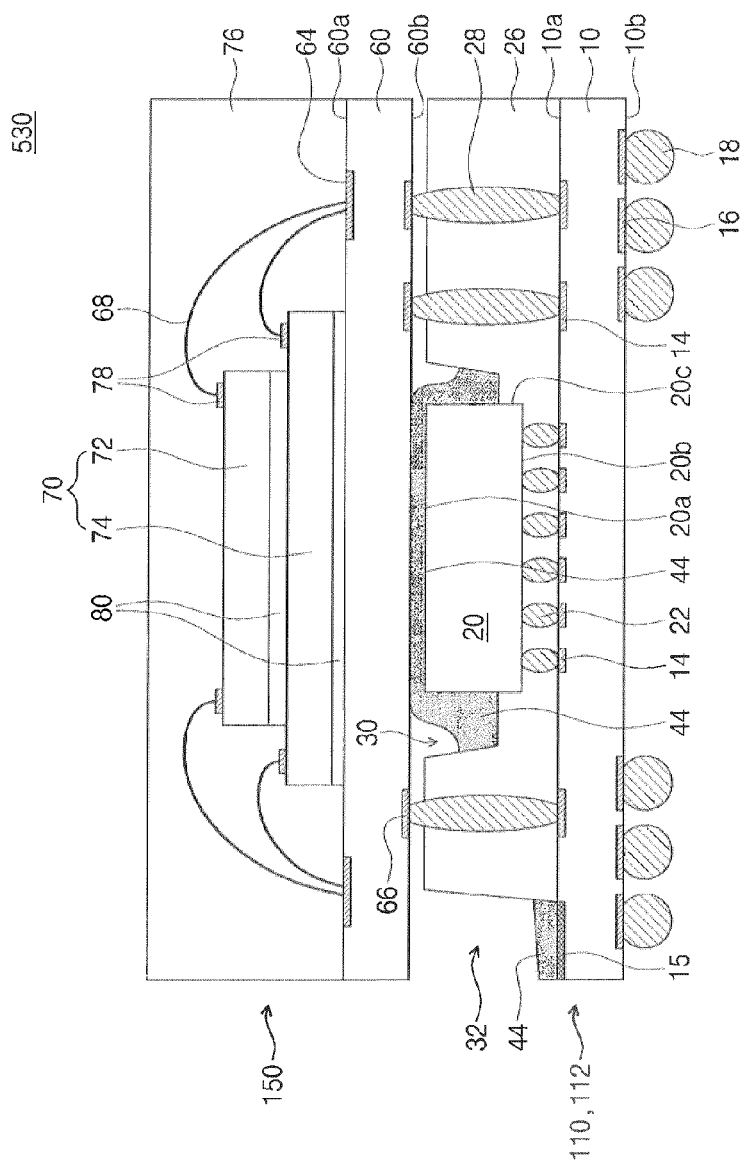

FIG. 17 is a schematic cross-sectional view illustrating a modified example of the PoP device 530 according to another exemplary embodiment of the present general inventive concept.

Referring to FIGS. 13A, 13B and 17, the modified PoP device 530 according to another exemplary embodiment of the present general inventive concept may include similar components as the PoP device 520 described with reference to FIG. 16 with an exception of a configuration of a second trench 32. Hereinafter, only differences therebetween will be described.

The second trench 32 may have the same configuration as that of the lower package 100, 102 of the PoP device 420 illustrated in FIG. 12. The conductive pad 15 exposed by the second trench 32 may contact the heat transfer member 44 disposed in the second trench 32. Thus, heat generated from the lower semiconductor chip 20 may be released to outside of the lower package 110, 112 through the conductive pad 15. Since heat generated from the lower semiconductor package 20 is released through the upper package 150 and the outer wall 52 of the lower package, heat release efficiency can be improved.

Figure 18:
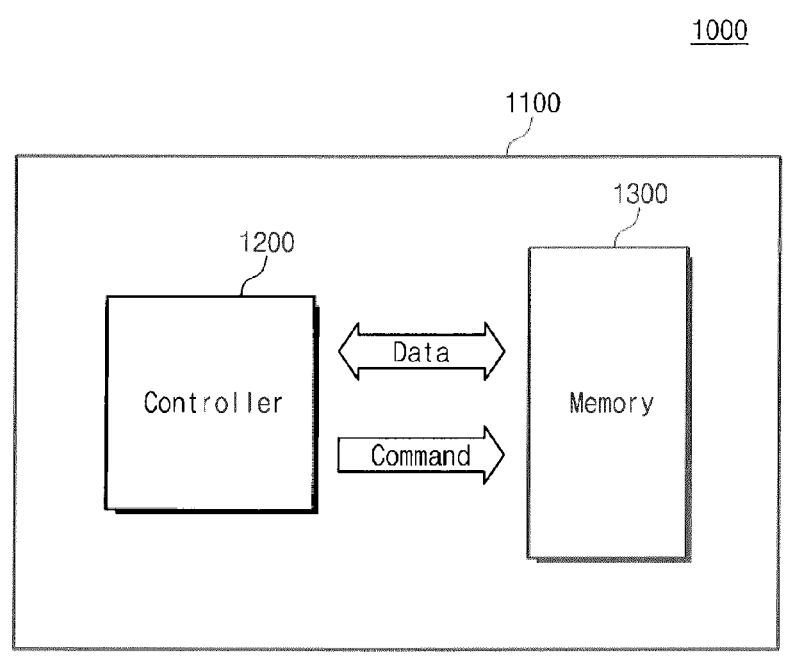
FIG. 18 is a schematic block diagram of a semiconductor system including the PoP devices according to the exemplary embodiments of the present general inventive concept.

FIG. 18 is a schematic block diagram of a semiconductor system 1000 including the PoP devices according to exemplary embodiments of the present general inventive concept.

Referring to FIG. 18, a semiconductor system 1000 according to an exemplary embodiment of the present general inventive concept may be a semiconductor storage device. For example, the semiconductor system 100 may be a memory card, or a solid state disk (SSD). The semiconductor system 100 may include a controller 1200 and a memory 1300 within a housing 1100. The controller 1200 and the memory 1300 may exchange electrical signal with each other. For example, the memory 1300 and the controller 1200 may transmit and may receive data according to commands of the controller 1200. Thus, the semiconductor system 100 may store data in the memory 1300 or output data to the outside from the memory 1300. The controller 1200 and the memory 1300 may include a PoP device according to various exemplary embodiments of the present general inventive concept.

Figure 19:
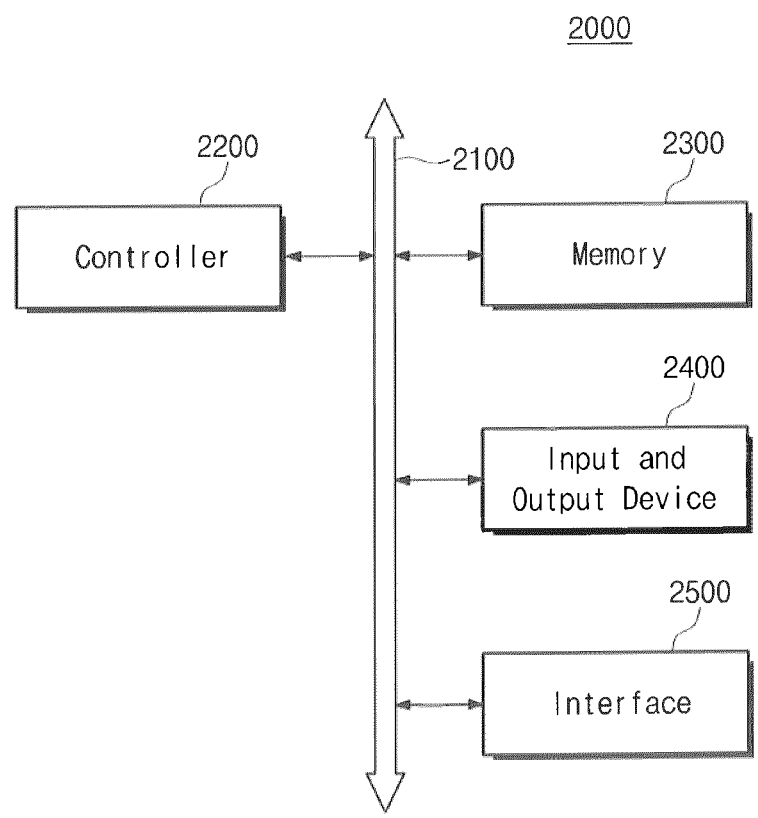
FIG. 19 is a schematic block diagram illustrating an example of an electronic system including the PoP devices according to the exemplary embodiments of the present general inventive concept.

FIG. 19 is a schematic block diagram illustrating an example of an electronic system 2000 including the PoP devices according to exemplary embodiments of the present general inventive concept.

Referring to FIG. 19, an electronic system 2000 may include a controller 2200, a memory 2300, and an input-output device 2400. The controller 2200, the memory 2300, and the input-output device 2400 may be coupled to each other through a bus 2100. The bus 2100 is a path through which data is transmitted. For example, the controller 2200 may include at least one of at least one microprocessor, a digital signal processor, a microcontroller, and logic devices that are capable of performing a same function that of the microprocessor, the digital signal processor, or the microcontroller. The input-output device 2400 may include at least one selected from a keypad, a keyboard, and a display device. The memory 2300 is a device for storing data. The memory 2300 may store data and/or commands executed by the controller 2200. The memory 2300 may include a volatile memory device and/or a nonvolatile memory device. Alternately, the memory 2300 may be formed of a flash memory. The flash memory may be formed of the SSD. In this case, the electronic system 2000 may stably store massive data in the memory 2300. The controller 2200 and the memory 2300 may include a PoP device according to various exemplary embodiments of the present general inventive concept. The electronic system 2000 may further include an interface 2500 for transmitting data through a communication network, or for receiving data from the communication network. The interface 2500 may be a wire-wireless configuration. For example, the interface 2500 may include an antenna, or a wire-wireless transceiver.

In a semiconductor package device according to the exemplary embodiments of the present general inventive concept, since a heat transfer member is disposed between a top surface of a lower semiconductor chip of a lower package and an upper package substrate, in a first trench formed in a molding compound layer around the lower semiconductor chip, and in a second trench extending to an outer wall of the lower package, heat generated from the lower semiconductor chip can be transferred to the upper package and the outer wall of the lower package to improve heat release efficiency.

In the semiconductor package device according to exemplary embodiments of the present general inventive concept, the first trench may be disposed around the lower semiconductor chip, and the second trench connected to the first trench may extend to the outer wall of the lower package. Therefore, the heat transfer member with fluidity flows onto the first and second trenches, respectively, from the top surface of the lower semiconductor chip and thus prevents via connection terminals from connecting to each other. Therefore, the signal transmission between semiconductor chips included in the upper and lower packages can be excellent in reliability.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor package device, comprising:
a lower package, comprising:
a lower package substrate,
a lower semiconductor chip mounted on the lower package substrate,
a lower molding compound layer disposed on the lower package substrate,
a first trench formed in the lower molding compound layer to surround the lower semiconductor chip, and
a second trench connected to the first trench to extend to an outer wall of the lower package, the second trench being formed in the lower molding compound layer;
an upper package disposed on the lower package, the upper package comprising:
an upper package substrate, and
at least one upper semiconductor chip mounted on the upper package substrate; and
a heat transfer member disposed between the lower package and the upper package.

2. The semiconductor package device of claim 1, wherein the outer wall of the lower package includes four sidewalls and four edges.

3. The semiconductor package device of claim 1, wherein the second trench extends from the first trench to at least one edge or at least one sidewall of the lower package.

4. The semiconductor package device of claim 1, wherein the heat transfer member is disposed between a bottom surface of the upper package substrate and a top surface of the lower semiconductor chip and in the first trench, or between the bottom surface of the upper package substrate and the top surface of the lower semiconductor chip and in the first and second trenches.

5. The semiconductor package device of claim 4, wherein at least one trench of the first and second trenches exposes the top surface of the lower package substrate.

6. The semiconductor package device of claim 5, further comprising:
a conductive pad disposed on the top surface of the lower package substrate exposed by the at least one trench,
wherein the conductive pad contacts the heat transfer member.

7. The semiconductor package device of claim 4, wherein the first trench exposes a side surface of the lower semiconductor chip.

8. The semiconductor package device of claim 1, wherein the first or second trench has an uneven bottom surface.

9. The semiconductor package device of claim 1, wherein the first and second trenches have depths or upper widths different from each other.

10. A semiconductor package device, comprising:
a lower package, comprising:
a lower package substrate on which a conductive pad is disposed on a top surface thereof,
a lower semiconductor chip mounted on the top surface of the lower package, substrate,
a lower molding compound layer disposed on the top surface of the lower package, substrate,
a first trench formed in the lower molding compound layer to surround the lower semiconductor chip, and
at least one second trench connected to the first trench to extend to an outer wall of the lower package, the at least one second trench being formed in the lower molding compound layer;
an upper package, comprising:
an upper package substrate disposed on the lower package, and
at least one upper semiconductor chip mounted on a top surface of the upper package substrate; and
a heat transfer member disposed between the top surface of the lower semiconductor chip and a bottom surface of the upper package substrate, and in the first trench.

11. The semiconductor package device of claim 10, wherein the outer wall of the lower package includes sidewalls and edges, wherein the second trench extends from the first trench to at least one edge or at least one side wall of the lower package.

12. The semiconductor package device of claim 11, wherein the heat transfer member is further disposed in the second trench.

13. The semiconductor package device of claim 12, wherein the second trench exposes the conductive pad of the lower package substrate, and the heat transfer member contacts the conductive pad.

14. The semiconductor package device of claim 11, further comprising:
a via connection terminal connecting the lower package substrate to the upper package substrate.

15. The semiconductor package device of claim 11, wherein the first trench exposes the lower package substrate.

16. The semiconductor package device of claim 11, wherein the first trench exposes a side surface of the lower semiconductor chip, wherein the heat transfer member contacts the side surface of the lower semiconductor chip.

17. A semiconductor package device, comprising:
a package substrate;
a semiconductor chip mounted on the package substrate; and a molding compound layer disposed on the package substrate, the molding compound layer comprising:
a first trench defined to surround the semiconductor chip, and
a second trench connected to the first trench to extend to an edge of the package substrate.

18. The semiconductor device of claim 17, wherein an outer wall of the package substrate includes sidewalls and edges, wherein the second trench extends from the first trench to at least one edge or at least one sidewall of the package substrate.

19. The semiconductor package device of claim 17, wherein the first trench or the second trench has an uneven bottom surface.

20. The semiconductor package device of claim 17, further comprising:
a conductive pad disposed on the top surface of the package substrate,
wherein at least one of the first and second trenches exposes the conductive pad.

* * * * *